United States Patent [19]

Madan

[11] Patent Number: 4,921,813
[45] Date of Patent: May 1, 1990

[54] METHOD FOR MAKING A POLYSILICON TRANSISTOR

[75] Inventor: Sudhir K. Madan, Austin, Tex.

[73] Assignee: Motorola, Inc., Schaumburg, Ill.

[21] Appl. No.: 258,545

[22] Filed: Oct. 17, 1988

[51] Int. Cl.[5] ...................... H01L 29/78; H01L 21/82
[52] U.S. Cl. ...................................... 437/46; 437/49; 437/56; 437/915; 437/192; 437/193; 437/57
[58] Field of Search ................ 437/46, 48, 49, 56, 437/57, 915, 29, 193, 43, 200; 357/23.5, 59 E

[56] References Cited

U.S. PATENT DOCUMENTS

| 4,597,159 | 7/1986 | Usami et al. | 437/49 |
| 4,657,628 | 4/1987 | Holloway et al. | 437/200 |
| 4,676,866 | 6/1987 | Tang et al. | 437/200 |
| 4,690,730 | 9/1987 | Tang et al. | 437/200 |
| 4,784,966 | 11/1988 | Chen | 437/56 |
| 4,794,565 | 12/1988 | Wu et al. | 357/23.5 |
| 4,804,636 | 2/1989 | Groover, III et al. | 437/56 |

FOREIGN PATENT DOCUMENTS 2516309  5/1983  France .................................. 437/29

OTHER PUBLICATIONS

"Electrically Alterable Avalanche–Injection–Type MOS Read–Only Memory with Stacked–Gate Structure" by Lizuka et al., IEEE Transactions on Electron Devices, vol. ED 23, No. 4, Apr. 1976, pp. 379–387.

Tang et al., "VLSI Local Interconnect Level Using Titanium Nitride" IEDM 85, pp. 590–593.

Primary Examiner—Brian E. Hearn
Assistant Examiner—Tuan Nguyen
Attorney, Agent, or Firm—James L. Clingan, Jr.

[57] ABSTRACT

An N channel transistor is formed in an active region of a substrate and a P channel transistor is formed in a second layer of polysilicon with a first layer of polysilicon forming the gate for both transistors. An interlayer oxide between the first and second polysilicon layers is used as a gate insulator for the P channel transistor. The first and second layers of polysilicon are formed before the source and drain of the N channel transistor are formed in the active region. The first and second layers of polysilicon are selectively etched to form a self-aligned strip of first and second polysilicon. The self-aligned strip is over a portion of the active region to expose portions of the active region on both sides of the self-aligned strip. The exposed portions of the active region are doped to form the source and drain of the N channel transistor with a channel therebetween. The second polysilicon portion of the self-aligned strip is selectively doped to form a source and a drain with a channel therebetween. Because the interlayer oxide is formed before the source and drain of the N channel transistor, the interlayer oxide can be formed for optimum integrity without adversely affecting the source and drain of the N channel transistor.

3 Claims, 5 Drawing Sheets

METHOD FOR MAKING A POLYSILICON TRANSISTOR

FIELD OF THE INVENTION

The invention relates to methods for making MOS transistor devices, and more particularly, to making MOS transistors which have the source and drain formed in polysilicon.

BACKGROUND OF THE INVENTION

The advantage of polysilicon transistors for use in a CMOS static random access memory (SRAM) cells has been known for quite some time. This type of cell generally has four N channel transistors formed in the substrate with two P channel transistors formed in the second layer of polysilicon. The two P channel transistors act as loads in place of the commonly-used resistor loads. The P channel transistors reduce power consumption while also improving cell stability. These advantages can also be obtained with P channel loads formed in the substrate but there is then a significant increase in the amount of space required for the cell. Having the P channel load in the second layer of polysilicon results in a cell which is nearly the same size as a cell which uses resistor loads. Even with these strong advantages, the difficulties in actually manufacturing such P channel load SRAM cells has resulted in the cell which uses resistor loads being the cell which is by far the most commonly manufactured.

One of the problems that is inherent in the P channel load cell is that N-type regions must be connected to P-type regions without the formation of a blocking PN junction. One solution to this problem was taught in U.S. Pat. No. 4,581,623, Wang. Another problem is the integrity of the gate insulator between the first and second polysilicon layers. The gate of the polysilicon transistor is formed in the first layer of polysilicon. The source, drain, and channel are formed in the second layer of polysilicon. The gate insulator is thus the interlayer insulator between the first and second polysilicon layers. The gate insulator needs to be thin enough so that the voltage on the gate can provide enough influence on the channel to provide the desired effect. The thinner the gate insulator, however, the more critical that the insulating material be of high integrity throughout. This is achieved by growing oxide at a relatively high temperature. After the first layer of polysilicon is deposited but before the interlayer insulator is formed, the sources and drains are formed in the substrate. The interlayer insulator is then formed but the high temperature needed to form a high integrity gate will deleteriously cause excessive diffusion of the source and drain regions in the substrate which have already been formed, causing short channel effects. Thus, as a compromise, the interlayer insulator is made thicker but grown or deposited at lower temperature. Annealing of the first polysilicon layer, which requires an extra heat cycle, is also desirably done to enlarge grain size to improve the performance of the polysilicon transistor. Because the extra heat cycle also increases the diffusion of source and drain regions in the substrate, the annealing must also be compromised. The annealing done at a lower than optimum temperature results in a grain size which is smaller than could be obtained but for the temperature limitations. The thick interlayer insulator and small grain size result in a polysilicon transistor which has high leakage when it is supposed to be non-conductive and is highly resistive when it is supposed to be conductive. Thus, over processing variations, the performance of the P channel load transistors formed in the second layer of polysilicon varied so widely that the improvement over the resistive loads could not be trusted and the increased process complexity further reduced yields. Thus, the resistive load cell has remained the design of choice for commercially viable SRAM products.

SUMMARY OF THE INVENTION

Accordingly, it is an object of the present invention to provide an improved method for making a polysilicon transistor.

In carrying out these and other objects of the invention, there is provided, in one form, a process for making a first transistor and a second transistor on a semiconductor substrate having an active region surrounded by field oxide. A first insulator is formed over the active region. A first polysilicon layer is formed over the first insulator layer and the field oxide. A second insulator is formed over the first layer of polysilicon. A second polysilicon layer is formed over the second insulator layer. The second polysilicon layer, the second insulator layer, and the first polysilicon layer are selectively etched to form a self-aligned strip comprised of an unetched portion of the first polysilicon layer, an unetched portion of the second insulator layer, and unetched portion of the second polysilicon layer. The etching includes etching over the active region so that the self-aligned strip has a portion over a middle portion of the active region so that a first portion and a second portion of the active region are separated by but not covered by the self-aligned strip. A source of the first transistor is formed in the first portion of the active region. A drain of the first transistor is formed in the second portion of the active region, which results in the formation of a channel of the first transistor between the first portion and second portion of the active region. A source and a drain of the second transistor are formed in two non-adjoining portions of the second polysilicon layer. The two non-adjoining portions are located in a portion of the unetched portion of the second polysilicon layer. A channel of the second transistor is thus formed between the two non-adjoining portions. The first transistor is thus comprised of the source and drain formed in the first active region and a gate formed from a portion of the unetched portion of the first polysilicon layer which overlies the first active region. The second transistor is comprised of the source and drain formed in the unetched portion of the second polysilicon layer and a gate formed from a portion of the unetched portion of the first polysilicon layer which is under the channel formed in the unetched portion of the second polysilicon layer.

DETAILED DESCRIPTION OF THE INVENTION

Figure 1:
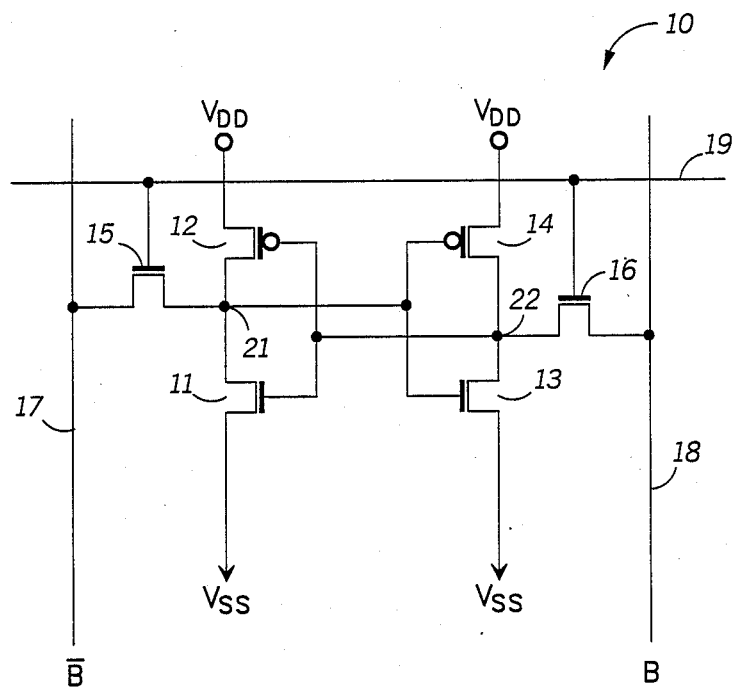
FIG. 1 is a circuit diagram of a conventional CMOS static RAM cell which is known in the art.

Shown In FIG. 1 is a conventional circuit diagram of a static RAM cell 10 comprised of an N channel transistor 11, a P channel transistor 12, an N channel transistor 13, a P channel transistor 14, an N channel transistor 15, and an N channel transistor 16. Transistors 15 and 16 operate as pass transistors utilizing the bilateral nature of MOS transistors by which drain and source functions of first and second current electrodes are interchangeable. Bit lines 17 and 18 in FIG. 1 are for providing a data bit signal in true and complementary form to or from cell 10. A word line 19 shown in FIG. 1 is for carrying a signal which will enable cell 10 for receiving or outputting the data bit signal.

Transistor 11 has a source connected to a negative power supply terminal $V_{SS}$ which is typically ground, a drain connected to a node 21, and a gate connected to a node 22. Transistor 12 has a source connected to a positive power supply terminal $V_{DD}$ which is typically 5 volts, a drain connected to node 21, and a gate connected to node 22. Transistor 13 has a source connected to $V_{SS}$, a drain connected to node 22, and a gate connected to node 21. Transistor 14 has a source connected to $V_{DD}$, a drain connected to node 22, and a gate connected to node 21. Transistor 15 has a first current electrode connected to node 21, a second current electrode connected to bit line 17, and a control electrode connected to word line 19. Transistor 16 has a first current electrode connected to node 22, a second current electrode connected to bit line 18, and a control electrode connected to word line 19.

Figure 2A:
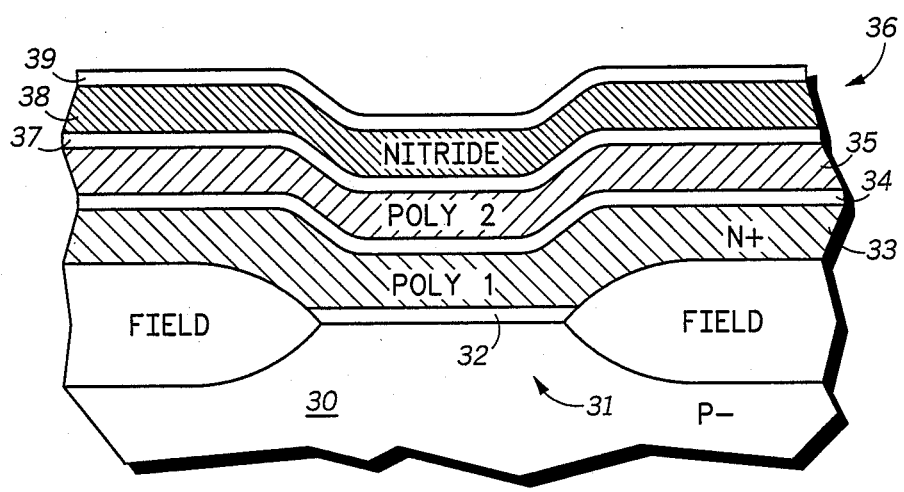
FIGS. 2A–2K are cross-sections of a polysilicon transistor taken at various stages in processing according to a preferred embodiment of the invention.

Shown in FIGS. 2A-2K are cross-sections of a P channel transistor and an N channel transistor which could be used, for example, as P channel transistor 12 or 14 and N channel transistor 11 or 13, respectively. The N channel transistor is formed in a P-silicon substrate 30 as shown in FIGs. 2A-2K. Active regions surrounded by field oxide are formed. Active region 31 is shown in FIGS. 2A-2K as one such active region. Formed over active region 31 is a gate oxide 32. Over gate oxide 32 is formed a layer of first polysilicon 33. First polysilicon layer 33 is doped to N+ to have a relatively high conductivity. Over first polysilicon layer 33 is formed an interlayer oxide 34. Over interlayer oxide 34 is formed a layer of second polysilicon 35. Over a second polysilicon layer 35 is formed an oxide-nitride-oxide (ONO) layer comprised of an oxide layer 37, a nitride layer 38, and an oxide layer 39. The resulting structure of these steps is shown in FIG. 2A. Gate oxide 32 acts as an insulator to insulate substrate 30 from first polysilicon layer 33. Interlayer oxide 34 acts as an insulator to insulate first polysilicon layer 33 from second polysilicon layer 35.

Figure 2B:
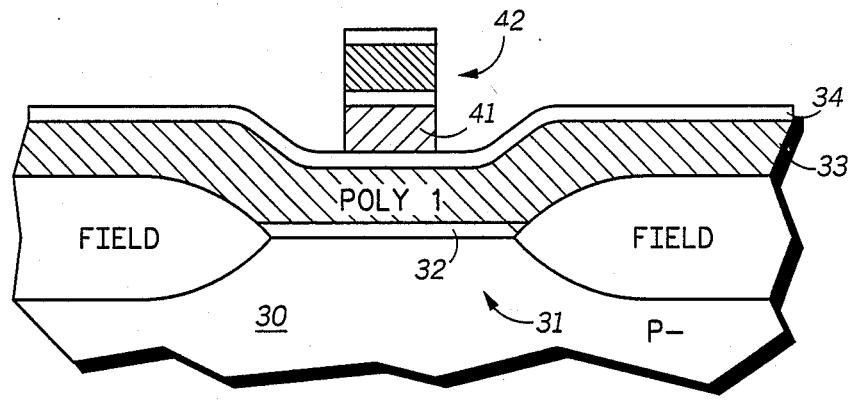
Figure 2C:
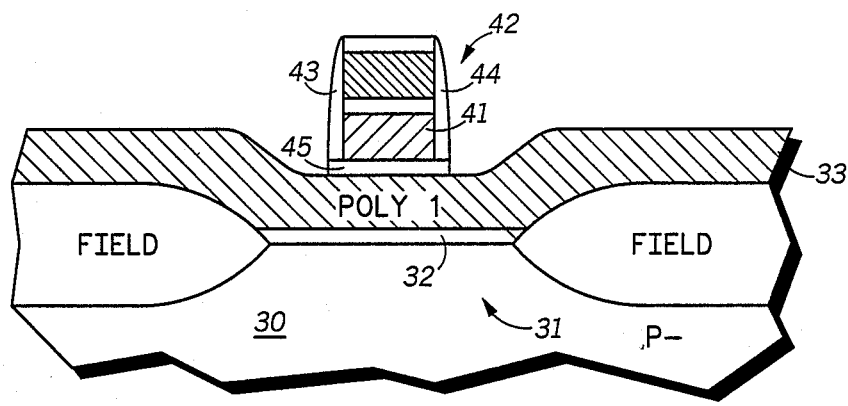
Figure 2D:
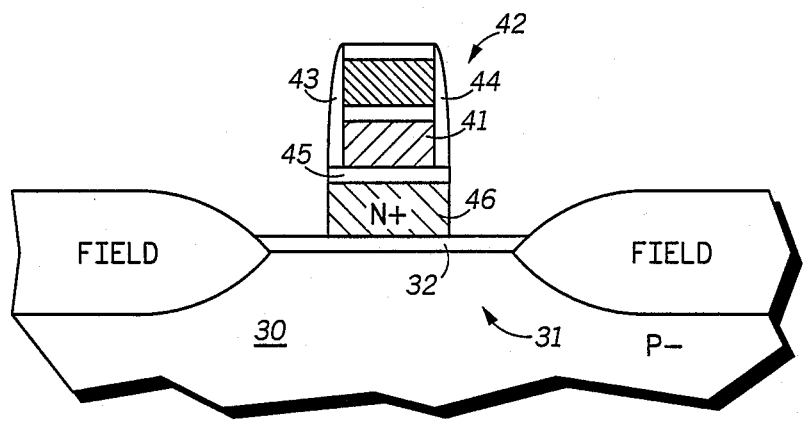

ONO layer 36 and second polysilicon layer 35 are selectively etched to form an unetched portion 41 of second polysilicon and an unetched portion 42 of ONO. The resulting structure of this selective etching is shown in FIG. 2B. Sidewall spacers 43 and 44 are formed on sides of portions 41 and 42. Interlayer oxide 34 is etched using portions 41 and 42, and sidewall spacers 43 and 44 as a mask leaving an interlayer oxide portion 45. The resulting structure after this step is shown in FIG. 2C. First polysilicon layer 33 is then selectively etched using the structure comprised of portions 41, 42, and 45 and sidewall spacers 43 and 44 as a mask leaving a first polysilicon portion 46. The resulting structure is shown in FIG. 2D. In addition to using the unetched second polysilicon and associated structure as a mask, an additional mask can be added so that other portions of first polysilicon are left unetched in addition to those under unetched second polysilicon. The portions of first polysilicon which are left unetched but are not under second polysilicon can be used for making gate connections from other circuit elements. The additional mask can be added to the structure of FIG. 2B before the selective removal of interlayer oxide 34.

Figure 2E:
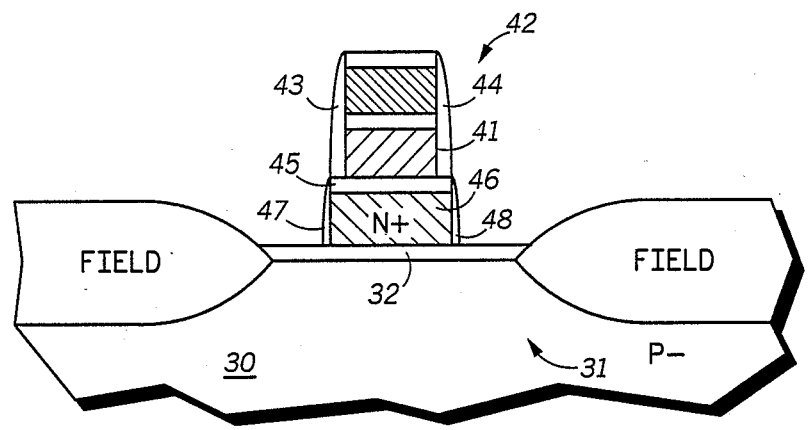
Figure 2F:
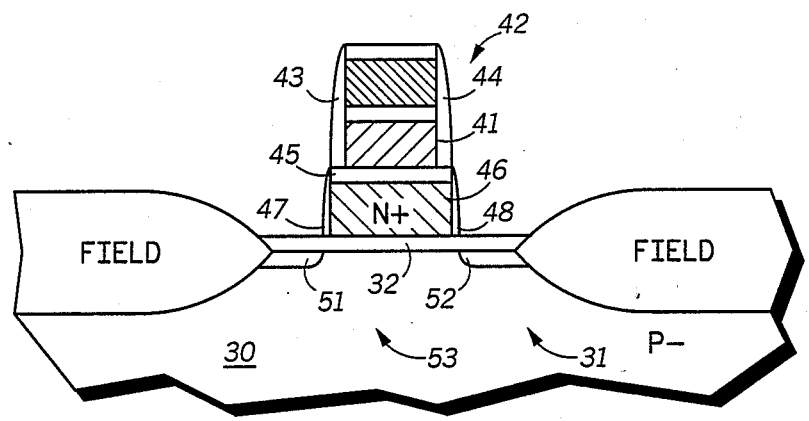

Oxide portions 47 and 48 are formed on sidewalls of first polysilicon portion 46 leaving the structure shown in FIG. 2E. Lightly doped N—source/drain regions are then implanted to form regions 51 and 52 leaving a channel region 53 therebetween. Sidewall spacers 43 and 44 protect second polysilicon portion 41 from receiving the N-type dopant which is used to implant the source/drain regions. Of course ONO portion 42 also protects second polysilicon portion 41 from this N-type implant. The resulting structure after forming lightly-doped source/drain regions 51 and 52 is shown in FIG. 2F.

Figure 2G:
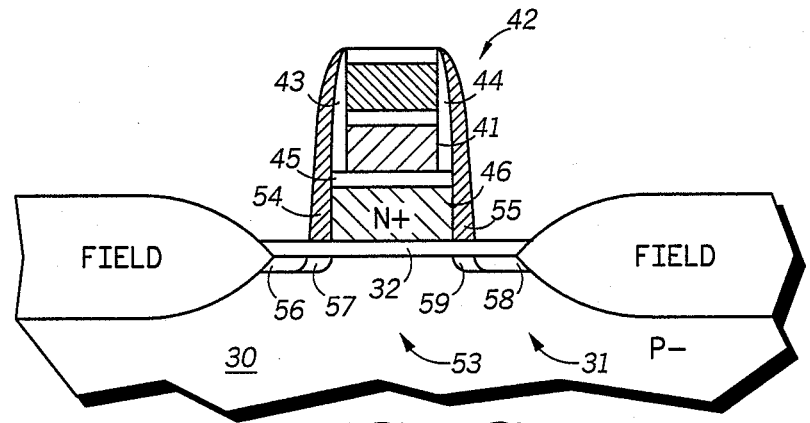

As is conventional for forming lightly-doped drain regions, sidewall spacers are formed to provide the masking for implanting into portions of the source/drain regions which are offset from the channel to increase the conductivity of the source/drain regions which reduces interconnect resistivity. Sidewall spacers 54 and 55 are shown in FIG. 2G. After formation of sidewall spacers 54 and 55, an N-type implant is performed which results in lightly-doped regions 51 and 52 of FIG. 2F each being converted to regions with an N—portion and an N+ portion. The resulting structure is shown in FIG. 2G which depicts the conversion of lightly-doped region 51 to and N+ region 56 and a remaining N—region 57 adjoining channel 53 and the conversion of lightly-doped region 52 to an N+ region 58 and a remaining N—region 59 adjoining channel 53. There are well known advantages of the lightly-doped drain structure but which do come at the expense of increased process complexity. Instead of implementing a lightly-doped drain structure, regions 51 could be doped to N+ instead of being lightly doped. In which case, sidewall spacers 54 and 55 of FIG. 2G would not need to be formed. In either case, there is developed a self-aligned structure over the channel, of first polysilicon over the gate insulator in the active region, an interlayer over the first polysilicon, and second polysilicon over the interlayer insulator to form a mask for the the formation of the source and drain in the substrate. The second layer of polysilicon is protected from being doped during the formation of the source and drain in the substrate. This structure has an inherent advantage which allows the formation of the interlayer insulator to occur before the formation of the source and drain. This is a significant advantage because the formation of the interlayer insulator can then be optimized without concern of such optimizing having a deleterious affect on the source and drain. If, for example, oxide is the intended interlayer insulator, the oxide can be formed at various temperatures. Integrity of such oxide, however, is substantially better if the temperature at which it is formed is higher than that at which sources and drains will significantly migrate both downward and into the channel. Both of these consequences are undesirable. There has thus been a tradeoff between the integrity of the interlayer oxide and the depth of the sources and drains. The solution has been to increase the thickness of the interlayer oxide to the point that the needed integrity is reached. This is, however, not desirable for the case in which the interlayer insulator is to act as a gate insulator when the source and drain of a transistor are to be formed in the second polysilicon layer. Another advantage is that the second layer of polysilicon need not have pass over sharp corners of the first polysilicon layer. Typically, in the past, second polysilicon had to overlap the first polysilicon at an etched corner of polysilicon. The present method allows implementation of a polysilicon transistor without requiring the second layer of polysilicon to overlap a sharp corner of etched first polysilicon.

Figure 2H:
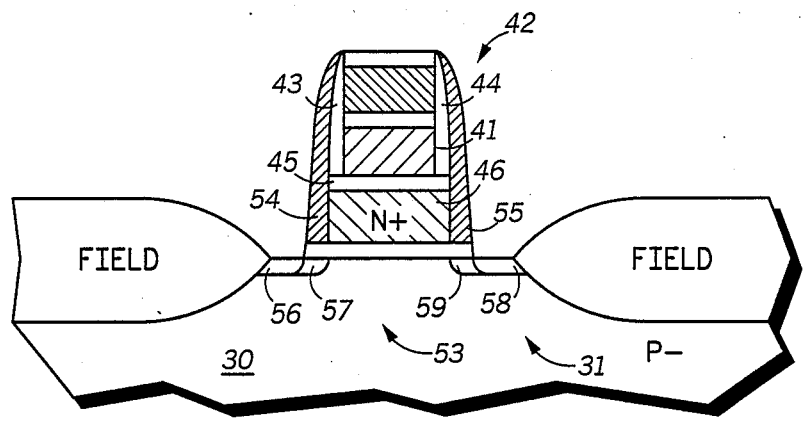
Figure 2I:
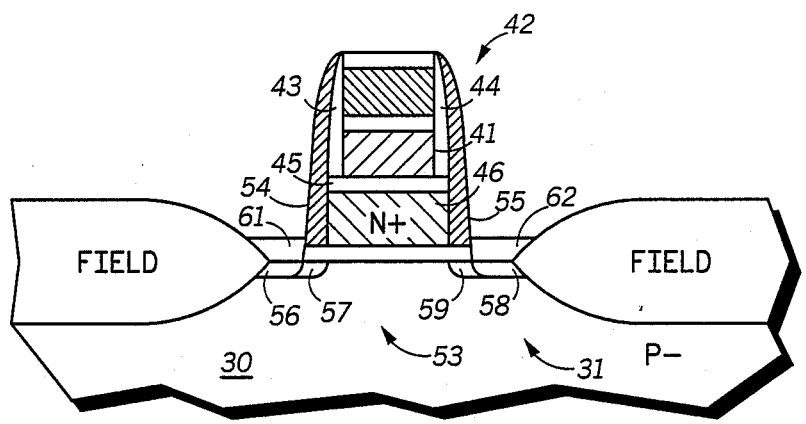
Figure 2J:
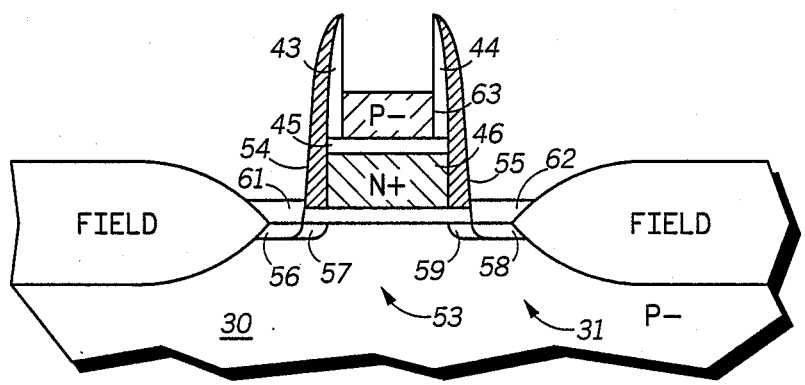

To complete formation of the P channel transistor, additional process steps are performed. One step, although not essential to forming the P channel transistors, is to cover the highly doped portions of the source and drain regions with titanium silicide. The titanium silicide can also be formed on the portions of first polysilicon left after etching which are not covered by second polysilicon. As shown in FIG. 2H, the insulator over regions 56 and 58 is removed and, as shown in FIG. 2I, portions 61 and 62 of titanium silicide are formed over regions 56 and 58, respectively. This formation of titanium silicide over sources and drains is known to reduce resistance and improve interconnecting of elements. The structure of FIG. 2J shows a P-region 63 formed in second polysilicon portion 41 which could be either the source or drain of the P channel transistor formed in second polysilicon. The source/drain region 63 shown in FIG. 2J is selected for doping to P-type by removing the ONO over the selected portion. The location of the channel is selected by not removing the portion of the ONO which overlies the intended channel location. The structure of FIG. 2I, particularly second polysilicon 41, shows how the channel of the P channel transistor looks in cross-section after the formation of the source and drain in second polysilicon according to the method of the preferred embodiment of the invention. The subsequent P-type implant is prevented from reaching the intended channel portion by the remaining ONO while the exposed portions of second polysilicon are P-doped. The N-type source/drains are protected from the P-type implant by the titanium silicide. As shown in FIG. 2J, titanium silicide regions 61 and 62 prevent the P implant from reaching N+ regions 56 and 58. Other techniques which may be used to protect the N+ source/drain regions from the P implant include photoresist application and etchback and the use of spin-on glass. There are portions of first polysilicon, not shown, which are exposed to the P-type doping but first polysilicon is heavily doped to N+ so that the exposed portions of first polysilicon remain N+. The exposed portions of first polysilicon are simply for making contact to the gates formed in first polysilicon. The effect of the relatively light P-type doping is thus insignificant. Additionally, titanium silicide is also applied to the exposed portions of first polysilicon which helps block the P implant.

Figure 2K:
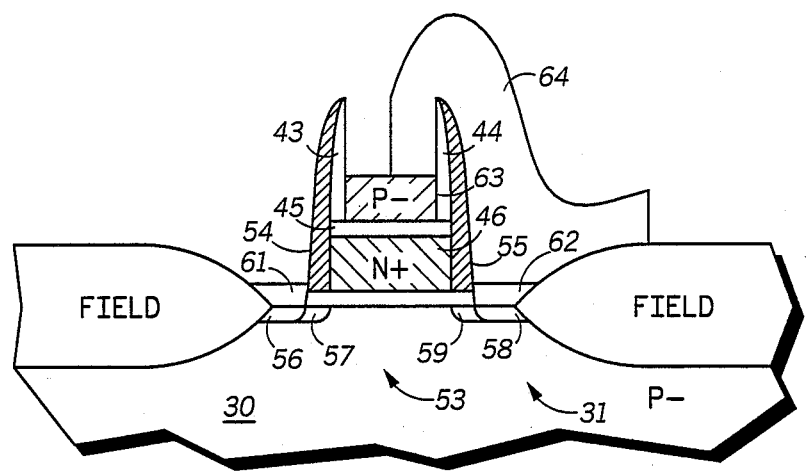

The drain of the P channel transistor must also be able to be connected to the drain of the N channel transistor as shown as nodes 21 and 22 in FIG. 1. This is achieved with titanium nitride which can be used effectively for this purpose of connecting a P-type region to an N-type region without forming a PN junction. Shown in FIG. 2K is a portion 64 of titanium nitride which connects drain region 63 to drain region 58 via titanium silicide portion 62. As shown in FIGS. 2I and 2J, the source/drain region 63 and the channel portion of second polysilicon portion 41 are both over active region 31. This is not necessary to implement the method of the preferred embodiment. The first polysilicon layer will extend beyond the active region in which the N channel transistor is formed so that one or more of, or portions of, the source, drain, and channel of the P channel transistor can be formed over field oxide or a combination of field oxide and active region. Similarly, the titanium nitride used for making the connection between drains of the P and N channel transistors can extend over field oxide as well in order to make the desired connection. The method disclosed allows for the formation of the source and drain of the transistor formed in the substrate to be formed after the the formation of the interlayer oxide. The preferred embodiment of the invention includes a provision for a lightly-doped drain approach and sidewall spacers to protect the second layer of polysilicon from being N-doped. Another approach that could be used to protect second polysilicon from the N-type implant is to undercut the second polysilicon during the etching of the second polysilicon so that the ONO would overhand the unetched second polysilicon. Yet another approach could be to oxidize second polysilicon after the etch of second polysilicon so to grow oxide at the polysilicon sides and move the polysilicon boundary under the ONO. Furthermore, these approaches can be used in combination.

To optimize the polysilicon transistor, the channel region of the polysilicon transistor could be lightly N-type, P-type, or undoped. The subsequent P implant does to form the source and drain would take into account that second polysilicon was already lightly N-type or P-type or undoped.

Figure 3:
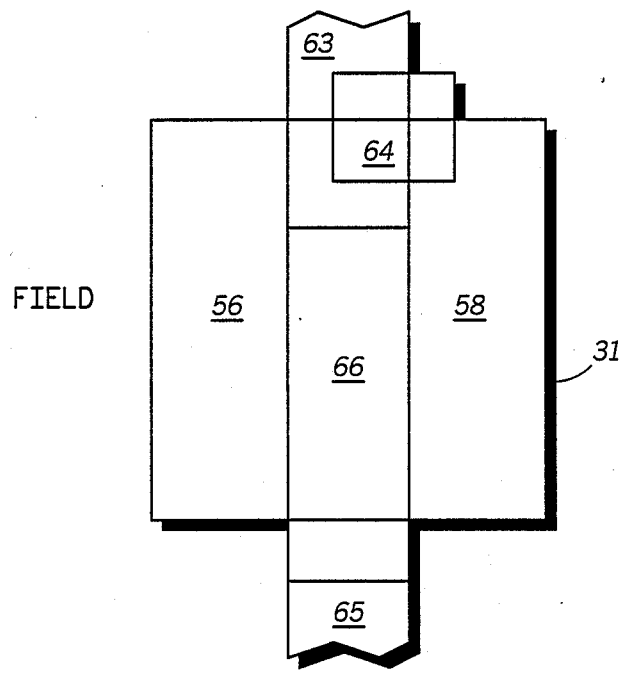
FIG. 3 shows a simplified layout of a polysilicon transistor made according to the method of the preferred embodiment.

Shown in FIG. 3 is a simplified layout of an N channel transistor and a P channel transistor which could be made according to the method of the preferred embodiment. Active region 31 is surrounded by field oxide. The second polysilicon layer of the self-aligned strip is divided into a channel 66 which is the portion of second polysilicon portion 41 over which ONO was not removed, drain 63, and a source 65 of the P channel transistor. In active region 31 are shown regions 56 and 58 for contacting the source and drain of the N channel transistor. Titanium nitride portion 64 is shown contacting drain 63 of the P channel transistor and region 58 of the N channel transistor in order to make the drain-to-drain contact of the N and P channel transistors. The self-aligned strip is shown crossing over active region 31 so as to leave at least two portions of active region 31 uncovered so that the source and drain of the N channel transistor can be formed in active region 31 after the formation of the self-aligned strip. As is apparent from FIG. 3, the source, drain, and channel locations of the polysilicon transistor can be either over field or active region or both. The source and drains of the polysilicon transistor could be formed before the substrate source and drain or even before first polysilicon is etched. The source and drain in second polysilicon could also be formed, via a mask, before second polysilicon is etched. Of course the source and drain would be located in the unetched portion of second polysilicon whether the source and drain are doped before or after the second polysilicon is etched. Another possibility is for second polysilicon to not have a separately doped source and drain but that the entire second polysilicon could be P−. The formation of source and drain in the polysilicon transistor would be making contact at ends of the particular polysilicon strip. In a similar fashion, the formation of source and drain in the substrate could be achieved using a Schottky barrier diode approach. The method described herein thus provides for a polysilicon transistor and a bulk transistor (a transistor which has its source and drain in the substrate) with a gate in first polysilicon which is common to both the polysilicon transistor and the bulk transistor. A method is thus provided by which a SRAM cell can be made using polysilicon transistors which realizes the cell layout and performance potential thereof. The potential of such SRAM cells has been known but has heretofore not been realized with manufacturing success.

While the invention has been described in a specific embodiment, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

I claim:

1. A process for making a first transistor and a second transistor on a semiconductor substrate having an active region surrounded by field oxide, said active region having a middle region and first and second region separated by the middle region, comprising;

forming a first insulator layer over the active region;

forming a first layer of polysilicon over the insulator layer and the field oxide;

forming a second insulator layer over the first layer of polysilicon;

forming a second layer of polysilicon over the second insulator layer;

forming a third insulating layer over the second layer of polysilicon;

selectively etching the third insulator layer and the second polysilicon layer to form a first strip comprised of an an unetched portion of the third insulator layer, and an unetched portion of the second polysilicon layer, said etching including etching over the first and second region of the active region so that said first strip has a portion over the middle region of the active region;

forming first sidewall spacers on the first strip;

selectively forming masks over portions of the first polysilicon layer;

etching the first layer of polysilicon in areas not covered by the first strip, the first sidewall spacers, and said masks to expose portions of the first and second regions of the active region leaving an unetched portion of first polysilicon;

doping the exposed portions of the first and second regions of the active region to form a first source in the first region and a first drain in the second region whereby a first channel is formed between said doped portions of the first and second regions;

forming second sidewall spacers on the unetched portion of the first polysilicon layer to cover portions of the doped portions of the first and second regions adjacent to the first channel;

further doping the doped portions of the first and second regions which are not covered by the second sidewall spacers; and doping two non-adjoining portions of the unetched portion of the second polysilicon layer to form therein a second source and a second drain whereby a second channel is formed therebetween;

whereby the first transistor is comprised of the first source and the first drain formed in the active region and a gate formed from a portion of the unetched portion of the first polysilicon layer which overlies the active region and the second transistor is comprised of the second source and second drain formed in the unetched portion of the second polysilicon layer and a gate formed from a portion of the unetched portion of the first polysilicon layer which is under the second channel formed in the unetched portion of the second polysilicon layer.

2. The process of claim 1 wherein the second insulator layer is oxide formed at relatively high temperature.

3. The process of claim 2 wherein the first source and the first drain are doped to N-type and the second source and the second drain are doped to P-type.

* * * * *